United States Patent [19]

Misawa et al.

[11] 3,773,628

[45] Nov. 20, 1973

[54] METHOD OF MAKING A LEAD ASSEMBLY

[75] Inventors: Akira Misawa; Gyoji Suzuki, both of Kanagawa-ken; Keiichi Nakamura, Tokyo, all of Japan

[73] Assignee: Sony Corporation, Tokyo, Japan

[22] Filed: May 6, 1971

[21] Appl. No.: 149,898

Related U.S. Application Data

[62] Division of Ser. No. 787,111, Dec. 26, 1968, abandoned.

[52] U.S. Cl. .......................... 204/15, 156/13, 156/18

[51] Int. Cl. ......... C23b 5/48, C23b 3/04, C23f 1/02

[58] Field of Search .................... 204/15; 156/8, 18, 156/13

[56] References Cited

UNITED STATES PATENTS

| | | | |
|---|---|---|---|
| 3,484,533 | 12/1969 | Kauffman | 174/52 |
| 3,325,319 | 6/1967 | Frantzen | 204/15 |
| 2,469,689 | 5/1949 | Gresham | 204/15 |
| 2,712,521 | 7/1955 | Aragones et al. | 204/15 |

*Primary Examiner*—Thomas Tufariello
*Attorney*—Alvin Sinderbrand

[57] ABSTRACT

In making a lead assembly, for example for connection to integrated circuit or semi-conductor devices, layers of a lead metal, such as, nickel or nickel alloy, are provided on selected areas of both surfaces of a relatively thick base metal sheet, for example, of copper or copper alloy, which is etched through using the lead metal layers as a mask for precisely determining the portions of the base metal sheet to be removed, with the remaining parts of the base metal sheet and the lead metal layers integral therewith defining the assembly of leads which are joined by an outer frame to be severed from the leads after the connection of the latter to electrodes of integrated circuits or semiconductor devices. The lead metal layers on one surface of the base metal plate may extend beyond the lead metal layers on the other plate surface so that, upon etching through the base metal plate from both surfaces thereof, the lead metal layers on said one surface of the base metal plate project beyond the remaining parts of the latter to constitute tips of the corresponding leads.

5 Claims, 22 Drawing Figures

METHOD OF MAKING A LEAD ASSEMBLY

This application is a division of U.S. Pat. application Ser. No. 787,111, filed Dec. 26, 1968 and now abandoned.

This invention relates generally to lead assemblies and to methods of making the same.

Lead assemblies have been proposed for connecting external leads with semiconductor integrated circuit elements formed on a semiconductor chip, individual semiconductor elements or circuit elements, such as resistors or capacitors. The conventional lead assemblies usually consist of an outer frame and a plurality of lead arms extending inwardly therefrom and which are formed as a unitary structure of a sheet metal of, for example, the material known commercially as Kovar. Lead assemblies constructed in the foregoing manner are mechanically weak and likely to be deformed when assembled with a semiconductor chip, as when the lead assembly and the semiconductor chip are coupled together in a unitary structure by a molded resin body. Even after the lead assembly is unitarily joined with the semiconductor chip or pallet, the lead assembly is mechanically weak and prone to damage. Thus, it is the existing practice to reinforce the lead assembly by attaching it to a frame or case of an insulating material, such as a ceramic. Further, since the conventional lead asembly is thin, its electrical resistance cannot be reduced to a desired minimum, and internal connection leads cannot be formed simultaneously with the external leads. In addition, the fabrication of the conventional lead assembly involves an etching process during which so-called side etching occurs to prevent extremely narrow spacing between tips of adjacent leads, for example, a tip spacing of less than 200 microns and also to prevent reduction of the width of the lead tips to less than 100 microns. Although the material Kovar is preferred in order to increase the mechanical strength of the conventional lead assembly, that material is relatively expensive.

Accordingly, it is an object of this invention to provide a lead assembly which is mechanically strong and which can be given an accurately predetermined pattern of lead arms.

Another object is to provide a lead assembly which consists of a relatively thick base metal of good conductivity and a nickel or nickel base alloy layer deposited thereon.

Another object is to provide a lead assembly fixedly mounted on an insulator base plate.

A further object of this invention is to provide a lead assembly having lead arms which are thin at the portions thereof which engage the surface contact areas of seimconductor devices.

It is still a further object of this invention to provide a method of making a lead assembly according to which a nickel or nickel alloy layer used as a lead metal layer on a base metal plate is further employed as an etching-proof mask for the selective removal of portions of the base metal.

In a lead assembly according to the invention, a relatively thick sheet metal of good conductivity, for instance, copper, is used as a base and lead metal layers of nickel or a nickel alloy are formed on the base as a unitary structure therewith. By reason of the foregoing, it becomes possible to make integrated circuit devices or semiconductor devices of low electrical resistance, and which are mechanically strong and reliable in operation, by joining the described lead assembly and semiconductor chips within a molded resin body after the necessary electrical connections have been made.

Further, in accordance with the present invention, the lead metal layer is utilized as an etching-proof layer or mask in the making of the lead assembly, so that precise etching is attainable to provide for enhanced accuracy in the formation of thin and narrow leads. In addition, the present invention facilitates the simultaneous formation of internal and external connection leads.

The above, and other objects, features and advantages of this invention, will become apparent from the following detailed description of illustrative embodiments to be read in conjunction with the accompanying drawings, in which.

Figures 1, 2, 3, 4, 6, 7, 8, 9, 10:
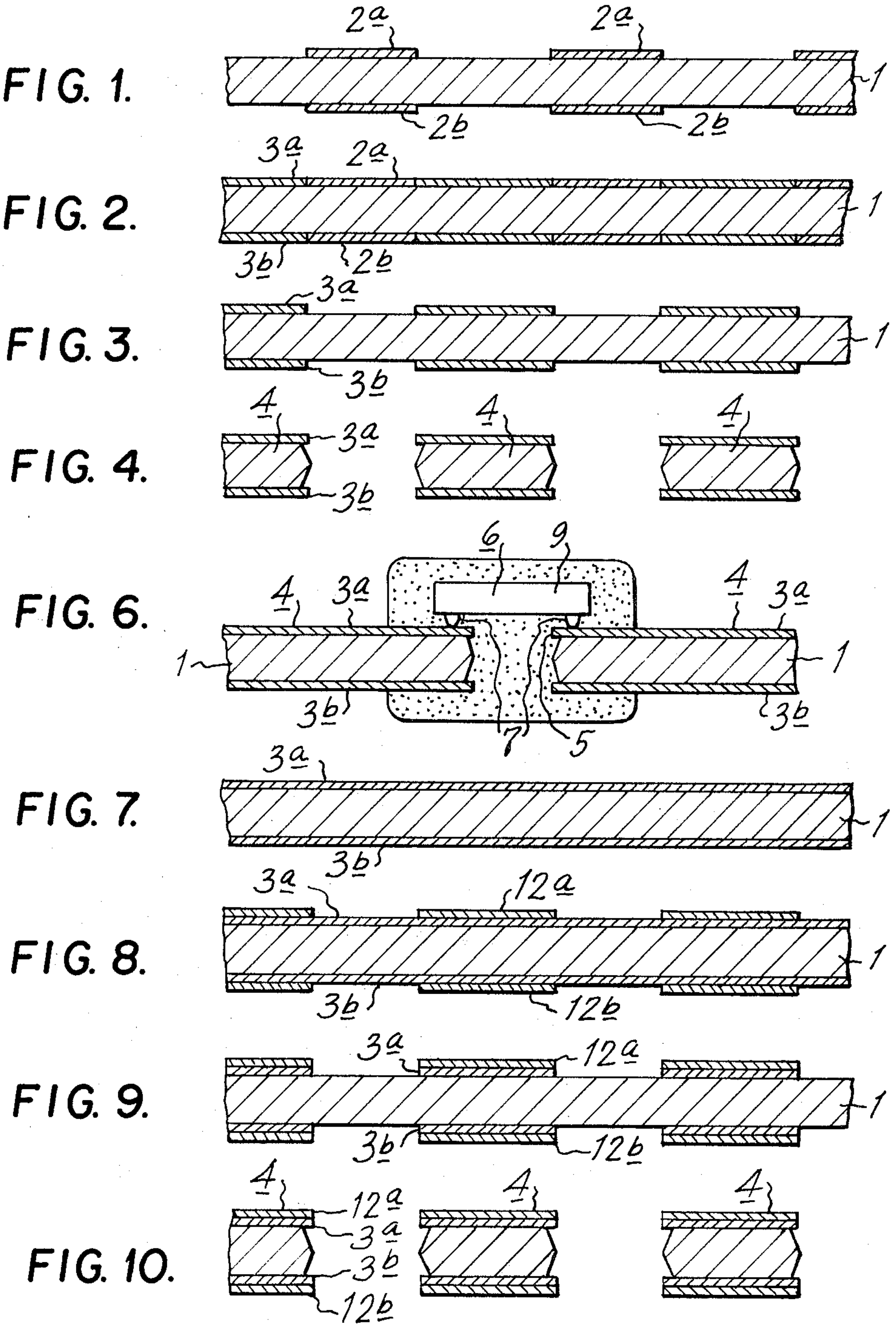
FIGS. 1 to 4 are sectional views illustrating a sequence of steps employed in the manufacture of a lead assembly for use with semiconductor elements according to one embodiment of this invention.
FIG. 6 is an enlarged fragmentary cross-sectional view of the lead assembly of FIG. 5 shown connected to a semiconductor element.
FIGS. 7 to 10 are sectional views illustrating a sequence of steps employed in the manufacture of a lead assembly according to another embodiment of this invention.

Referring in detail to FIGS. 1 to 4, there will now be described, by way of example, a sequence of steps involved in the manufacture of a lead assembly according to this invention.

The first step is to provide a metal plate 1 (FIG. 1) of, for example, rectangular form which will be used as the base metal of the final lead assembly. Since the base metal plate 1 will form external leads for connections to electrodes of integrated circuit elements, it is necessary that the base metal plate 1 be formed of a material which is low in electric resistance, flexible and easy to handle so as to facilitate the connecting thereof to other elements or parts. Generally, copper and copper alloys are high in conductivity, low in electric resistance, relatively soft, easy to process and inexpensive and readily available, and consequently copper or brass satisfies the above requirements for plate 1. Further, the base metal plate 1 has a moderate thickness of, for example, 200 microns, so as to be mechanically strong enough to serve as a lead assembly. The entire areas of both surfaces of base metal plate 1 are coated with photo-resist layers, for example, of a material such as that available commercially under the name of KPR or AZ. The photo-resist coated surfaces of the base metal plate 1 are exposed to irradiation by light through a mask having a predetermined pattern and are then subjected to a developing process to remove the photo-resist layers selectively at those areas corresponding to the pattern of lead arms which are to be ultimately obtained. Reference numerals 2*a* and 2*b* indicate those portions of the photoresist layers remaining after the selection removal by the developing process.

Next, the exposed regions of both surfaces of the base metal plate 1 have metal layers 3*a* and 3*b* of nickel or a nickel alloy deposited thereon by means of, for example, electrolytic plating, as illustrated in FIG. 2. The nickel alloy may be, for instance, a nickel-silver, nickel-gold or like alloy, having a strong affinity for the aforementioned base metal plate and a great bonding strength therewith. In addition, when circuit elements are connected with the completed lead assembly by the so-called face-down bond method, as hereinafter described, the aforementioned nickel or nickel alloy can be directly connected with solder deposited on electrodes of a semiconductor pellet, so that the nickel or nickel alloy is well coupled with the pellet both mechanically and electrically. In this case it is preferred that the thickness of the metal layers 3*a* and 3*b* be equal to or smaller than that of the photo-resist layers 2*a* and 2*b*. Accordingly, since the photo-resist layers 2*a* and 2*b* can be formed with a thickness of about 10 microns, the thickness of the metal layers 3*a* and 3*b* may also be about 10 microns. When using a sulfamate nickel solution for the selective plating of base plate 1 with nickel or nickel alloy, the metal layers 3*a* and 3*b* with a thickness of about 10 microns can be educed on the base metal in three minutes or so at a moderate current density. The metal layers 3*a* and 3*b* may be formed on base plate 1 by means of vapor deposition, rather than by plating, if such is desired.

Following the formation of the metal layers 3*a* and 3*b*, the photo-resist layers 2*a* and 2*b* are removed, for example, by the use of a toluene solution, as shown on FIG. 3. Then, the base metal 1 is subjected to etching from both sides through metal layers 3*a* and 3*b* serving as a mask which will be ultimately used as lead metals. The etchant in this case may be an ammonium persulfate 25 percent solution or ferric chloride solution. In the case of the use of the ammonium persulfate solution, etching at room temperature leads to selective removal of the base metal plate 1 only, and the layers 3*a* and 3*b* formed of nickel are unaffected thereby, as shown on FIG. 4, thereby leaving portions 4 of the laminate of base metal and nickel layers.

Figure 5:
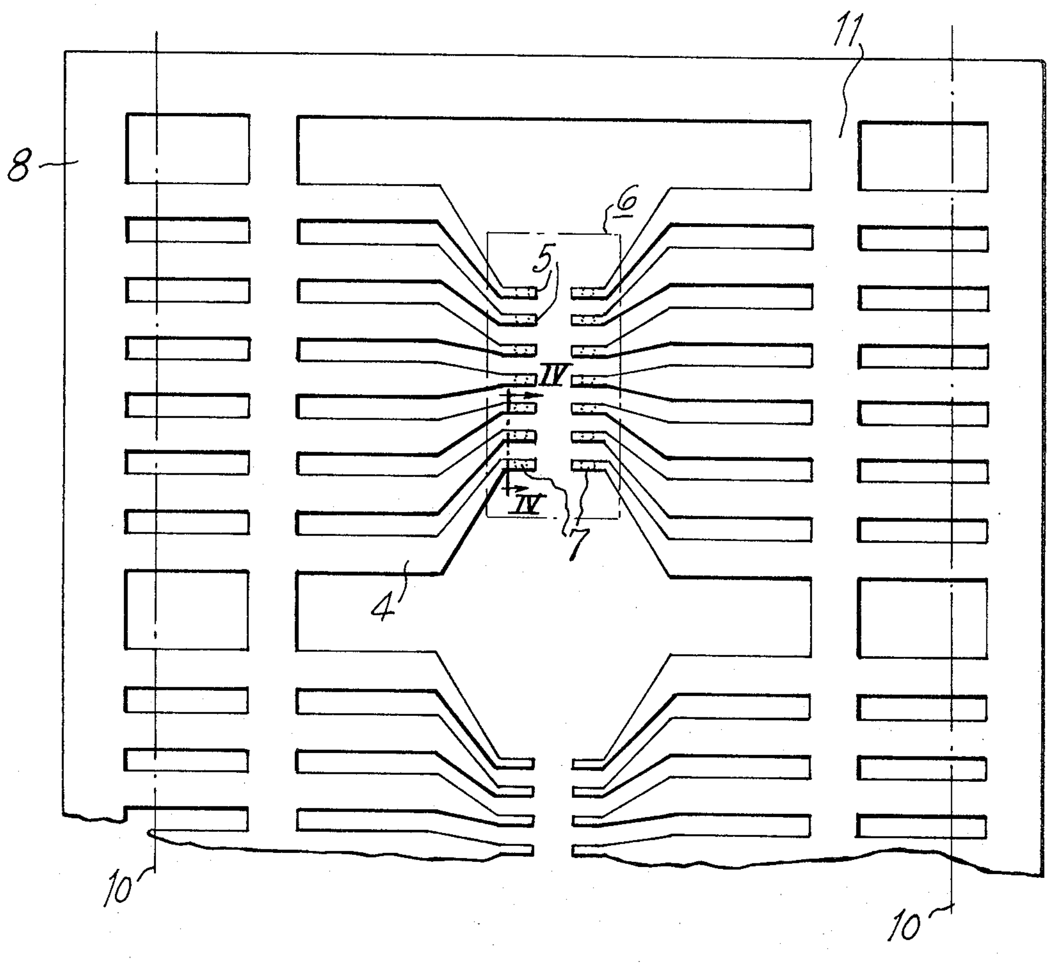
FIG. 5 is a plan view showing one example of a lead assembly produced according to this invention.

In FIG. 5 there is illustrated a lead assembly produced according to the method described above with reference to FIGS. 1 to 4. In FIG. 5, the numerals 4 indicate lead arms having tips 5 which are to be directly connected with electrodes 7 of semiconductor elements, for example, integrated circuit elements formed on a semiconductor pellet 6. The lead arms 4 are interconnected by an outer frame 8. After the electrodes 7 of the semi-conductor elements on the pellet 6 have been directly engaged with the tips 5 of lead arms 4 and a body 9 of an exposy resin has been molded therearound, as shown on FIG. 6, the lead assembly is severed along the chain lines 10 on FIG. 5 and then the interconnecting portions 11 between adjacent lead arms are removed to render the lead arms independent of each other.

In the process described above, a metal, such as gold or silver, may be formed on the metal layers 3*a* and 3*b* by means of plating. Further, the photo-resist layers 2*a* and 2*b* may by similar layers of an epoxy ink or phenol ink applied by a screen printing method.

Referring now to FIGS. 7 to 10, it will be seen that, in another example of this invention, a base metal plate 1 of copper to form the base of the completed lead arms has both of its surfaces coated with metal layers 3*a* and 3*b* by electrolytic plating with nickel or a nickel alloy. In this electrolytic plating a nickel chloride solution may be used, or a nickel sulfamate solution may be employed, as in the first described example. The thickness of the layers 3*a* and 3*b* can be selected to be about 10 microns as before.

The entire surfaces of metal layers 3*a* and 3*b* arc coated with photo-resist layers 12*a* 12*b*, for example, of a material such as KPR or AZ, after which the coated surfaces are exposed to light and are then subjected to a developing process to remove selected areas of the photoresist layers while leaving the layers 12*a* and 12*b* (FIG. 8) in a pattern corresponding to that of the lead arms to be ultimately obtained.

Thereafter, the exposed metal layers 3*a* and 3*b* are etched away as shown on FIG. 9. Where the metal layers 3*a* and 3*b* have been formed of nickel, as in the foregoing example, it is possible to etch away the exposed portions of the metal layers with an ammonium persulfate 25 percent solution heated a little, for example, up to about 60°C. Following this, the base metal plate 1 is selectively etched away with a similar etchant at room temperature, as depicted in FIG. 10, thereby providing a lead assembly similar to that above described with reference to FIG. 5. Finally, the KPR layers 12*a* and 12*b* are removed, as with a toluene solution. It is also possible, in the process step illustrated by FIG. 9, to selectively etch away the exposed portions of the nickel plated layers 3*a* and 3*b* with a solution composed of glycerine and $HNO_3$ in the ratio of 1 to 1, and then to selectively etch away the base metal plate 1 with an ammonium persulfate 25 percent solution at room temperature. In the example of FIGS. 7 to 10, the nickel plated layers 3*a* and 3*b* can be deposited to have a thickness larger than that of the layers 3*a* and 3*b* in the example of FIGS. 1 to 4. If necessary, the nickel layers 3*a* and 3*b* can be covered with thin layers of gold deposited on the nickel layers by plating or the like.

Since the etching of the base metal plate 1 employs the metal layers 3*a* and 3*b* of nickel or a nickel alloy as the masks for the etching operation, the sensitivity and accuracy of the etching operation can be enhanced. This is to be distinguished from the prior art in which photoresist layers of KPR or the like are employed as the masks for the etching of the base and metal plate. Such photo-resist layers of KPR or the like are adversely affected by moisture and readily come off the base metal plate during etching, making it impossible to accurately control the areas that are etched away according to predetermined patterns.

Further, simultaneous etching of the base metal plate 1 at the exposed areas of its upper and lower surfaces minimizes the influence of the so-called side etching and provides for enhanced precision of the etching.

In the foregoing examples, the tips of the lead arms are of the same thickness as the other portions of the arms, and by reason thereof difficulty is encountered in assembling the semiconductor chip or pellet with the lead arms and, even after such assembly, the semiconductor chip is likely to be broken by a stress resulting from bending of the external leads.

Referring now to FIGS. 11 to 16, it will be seen that the lead assembly, as there illustrated, has lead arms which are relatively thin only at their tips to avoid the above mentioned disadvantages. More specifically, as shown on FIG. 12, a copper plate 21 to serve as a lead base has photo-resist layers 22*a* and 22*b* deposited on its upper and lower surfaces 21*a* and 21*b* at those areas which will be ultimately etched away. As shown, each resist layer 22*b* extends beyond the corresponding resist layer 22*a* at the portion of plate 21 which is to form the tip of each lead arm.

Figure 13:
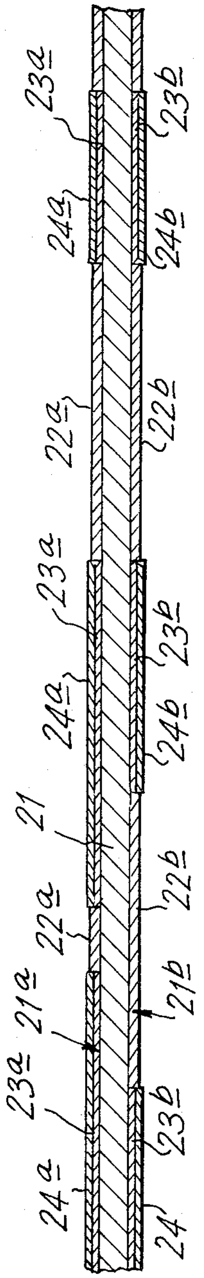

Then, metal layers 23*a* and 23*b* are deposited by electrolytic plating on both surfaces of the base metal plate 21 masked by the photo-resist layers 22*a* and 22*b* and, if necessary, second metal layers 24*a* and 24*b* are similarly formed on the metal layers 23*a* and 23*b* by means of electrolytic plating, as depicted in FIG. 13. The metal layers 23*a* and 23*b* are formed of a metal which strongly resists etching away by subsequent etching of the base metal plate 21. When the base metal plate 21 is formed of copper, the metal layers 23*a* and 23*b* may be formed of nickel, chrome, silver, gold, tin or solder and are deposited, for example, to a thickness of 25 to 30 microns. The second or outer metal layers 24*a* and 24*b* may be provided in cases where the difference is small between the etching speeds of the metal layers 23*a* and 23*b* and the base metal plate 21, and layers 24*a* and 24*b* may be formed of an etching-proof material such as gold, silver or the like. These metal layers 23*a*, 23*b*, 24*a* and 24*b* may be formed by vapor deposition of the like, rather than by electrolytic plating.

Figure 11:
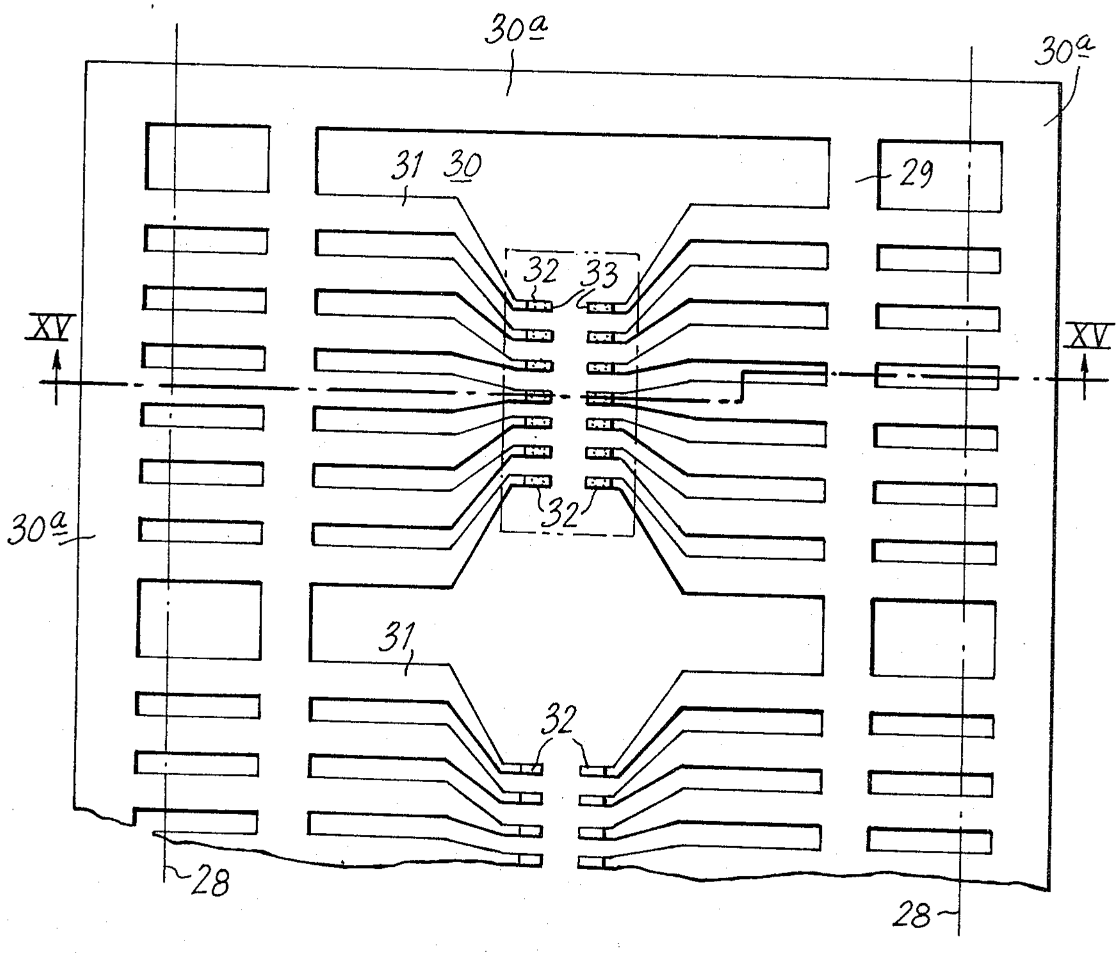
FIG. 11 is a plan view showing another example of a lead assembly produced according to this invention.
Figure 12:
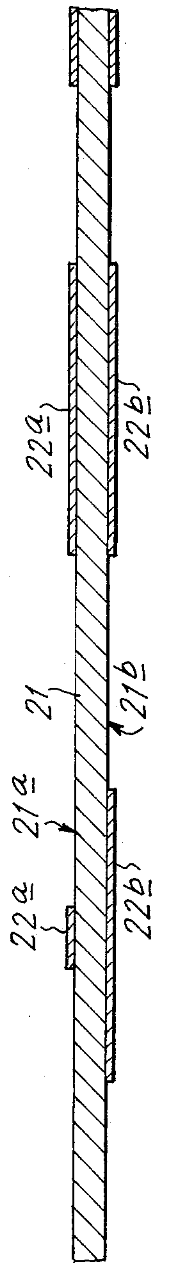
FIGS. 12 to 14 are sectional views showing a sequence of steps in manufacturing the lead assembly of FIG. 11.
Figure 14:
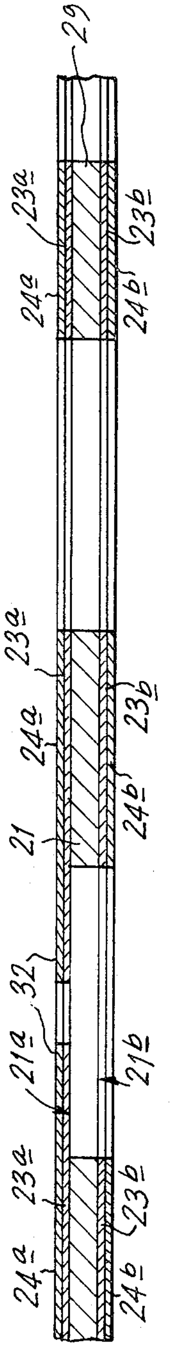
Figure 15:
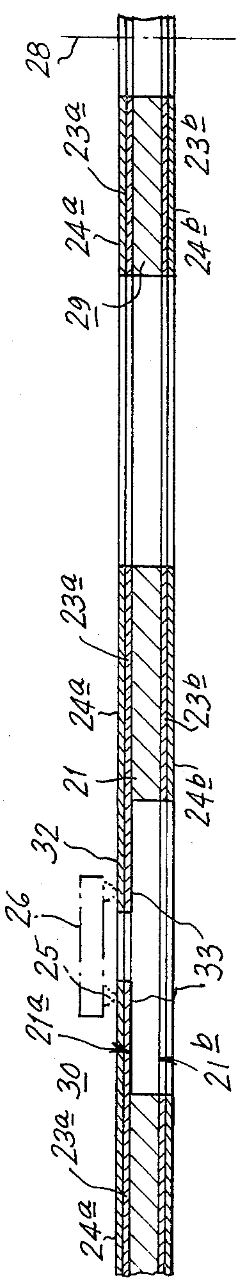
FIG. 15 is an enlarged sectional view taken along the line XV—XV on FIG. 11.

Subsequent to the formation of the first and second metal layers 23*a*, 23*b* and 24*a*, 24*b*, the photo-resist layers 22*a* and 22*b* are removed, and then the base metal plate 21 is subjected to etching from both sides (FIG. 14). The etchant for removing the exposed portions of plate 21 may be a mixed solution of ferric chloride or ammonium persulfate 25 percent solution with phosphoric acid in the case where the base metal plate 21 is of copper. This etching removes selected areas of the base metal plate 21, as shown on FIG. 14, while leaving the metal layers 23*a* and 23*b* and the metal layers 24*a* and 24*b*, with portions 32 of the layers 23*a* and 24*a* extending beyond the remaining portions of plate 21 to constitute the tips 33 of respective lead arms 30 (FIGS. 11 and 15). If desired, the etching of plate 21 from its bottom surface 21*b*, may be interrupted while a layer of the copper of plate 21 remains on the underside of the portions 32 of layers 23*a*, 24*a* to provide additional support thereto.

The base metal plate 21 may be subjected to etching after removing only the photo-resist layer 22*b* at those areas corresponding to the tips of the lead arms, whereby to etch away the base metal plate 21 from its underside 21*b* to a depth that is substantially half its thickness. Then the remaining photo-resist layers 22*a* and 22*b* are removed and etching continues from both surfaces of the plate 21. In this way, the time for etching of the tips of the lead arms is equal to that for the other portions, so that no excessive etching occurs to disturb the desired precision in etching. Further, the lead assembly may be plated over the entire surface with nickel or the like for mechanical reinforcement. As shown particularly on FIG. 11, a lead assembly produced as described above, may have a large number of lead arms 30 mechanically interconnected by an outer frame 30*a* and each having a major portion or length 31 constituted by base metal plate 21 and plated layers 23*a*, 23*b* and 24*a*, 24*b* on its opposite surfaces, with the tip 33 of each arm 30 being constituted only by the projecting portion 32 of layers 23*a*, 24*a*.

In such a lead assembly the tips 33 of the lead arms 30 are thin so that the spacing between adjacent tips 33 and the width of such tips can be extremely small. Accordingly, the described lead assembly is of particular utility when employed in leading out electrodes of miniaturized integrated circuits.

Figure 16:
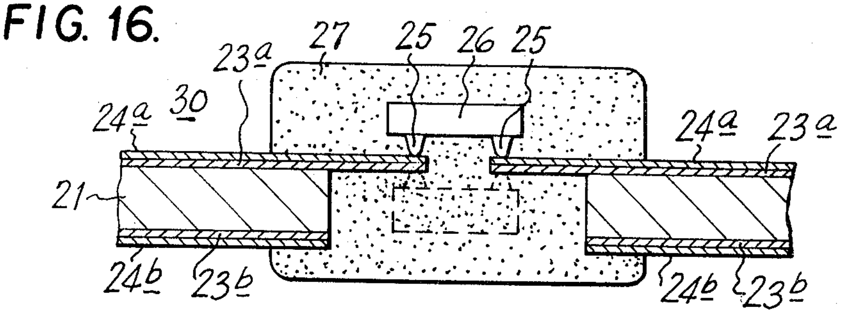
FIG. 16 is a view similar to that of FIG. 6, but showing the lead assembly of FIG. 11 connected to a semiconductor element.

Referring to FIGS. 15 and 16, it will be seen that an integrated circuit 26 having formed thereon many projecting electrodes 25 may be coupled with the lead assembly by the so-called face-down-bond method in such a manner that the electrodes 25 engage the tips of the lead arms 30 after which the lead arms 30 and the integrated circuit 26 are embedded within a molded body 27, for example, of epoxy resin, as depicted in FIG. 16. Then, the lead arms 30 are severed at the locations of dotted lines 28 on FIGS. 11 and 15 and interconnecting portions 29 between adjacent lead arms are removed to render the arms independent and thus provide an integrated circuit device. The integrated circuit 26 may be attached to the lead arm tips 33 at the sides of the latter constituted by layer 24*a*, as shown in full lines on FIG. 16, or at the sides of tips 33 constituted by layer 23*a*, as shown in broken lines on FIG. 16. Further, the aforementioned layers 23*a*, 23*b* and 24*a*, 24*b* may be replaced by a large number of similarly applied layers.

As has been described above, the embodiment of FIGS. 11 to 16 facilitates the production of a lead assembly in which the lead arms have extremely small spacing therebetween, for example, a spacing of 100 microns, and also have a very narrow width, for example, of about 50 microns. Further, the base metal plate 21 which constitutes the major portion of the mass of the assembly may be formed of a desired material, such as copper or the like, and accordingly the lead assembly of this invention is relatively inexpensive.

Although the preset invention has been described as applied to a lead assembly for use with an integrated circuit, it will be apparent that the invention is applicable to other semiconductor elements such as transistors and the like.

In the foregoing examples of the invention, internal connection leads for the respective electrodes of each integrated circuit or for interconnecting the electrodes of adjacent integrated circuits cannot be incorporated in the lead assembly at the same time as the aforementioned external leads. However, internal connection leads are often required together with the external leads.

FIGS. 17 to 22 illustrate another embodiment of this invention in which internal connection leads are formed together with external leads. As shown particularly on FIGS. 17 and 22, the lead assembly of this embodiment may have a large number of external lead arms 50 which are directly connected with corresponding electrodes 45 of, for instance, integrated circuit elements 46. Each of the lead arms 50 has a major portion 51 (FIG. 17) which consists of thin metal layers 43*a*, 44*a* and 43*b*, 44*b* formed on the opposite surfaces of a metal base plate 51 and a tip 53 constituted only by layers 43*a*, 44*a* which is connected with the respective electrode. The external lead arms 50 are mechanically connected to each other to form a unitary structure, as by an outer frame 50*a*.

Further, in the present example a base plate 55 of an insulating material, such as glass or ceramics, is mounted on the lead assembly at the side of the lead arms 50 constituted by layers 43*a*, 44*a* and is dimensioned to extend from the central portion to the tips 53 of arms 50. On the base plate 55, internal connection leads 50' similar to the external lead arms 50 are deposited in predetermined pattern, and tips 53' of these internal leads 50' are also formed in the same manner as those of the external lead arms 50.

With reference to FIGS. 18 to 22, it will be seen that a lead assembly as described above may be produced starting with a rectangular copper plate 41 of suitable thickness, for example, 200 microns.

Figure 17:
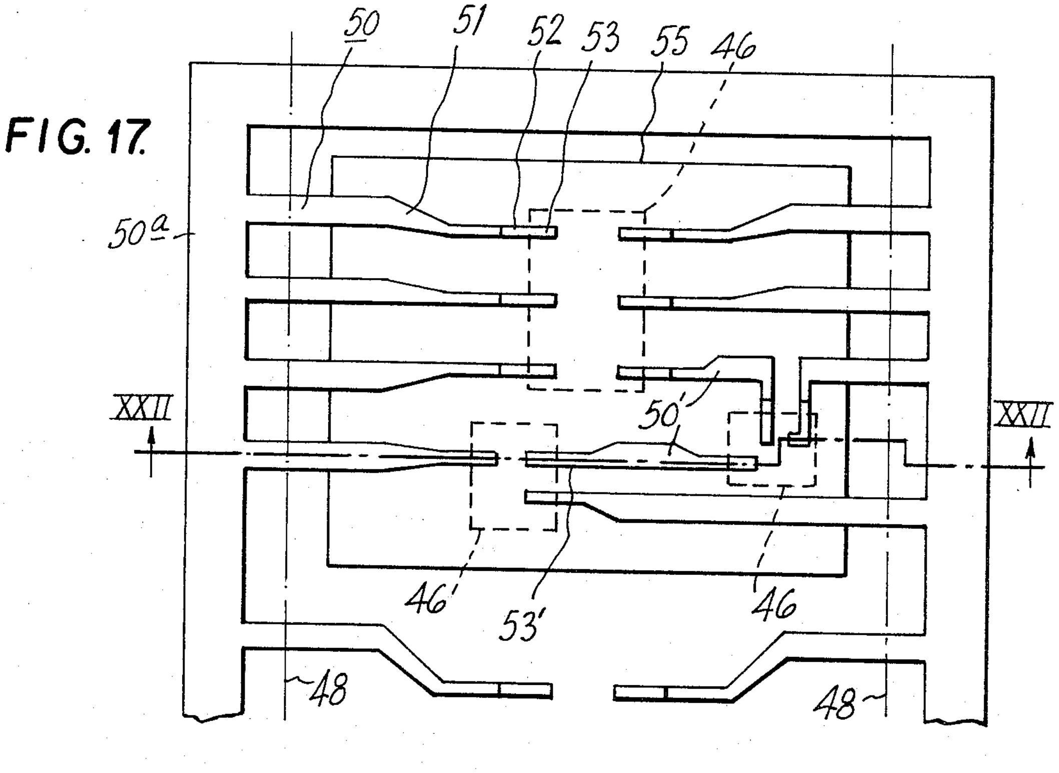
FIG. 17 is a plan view showing another example of a lead assembly for use with semiconductor elements produced in accordance with this invention.
Figure 22:
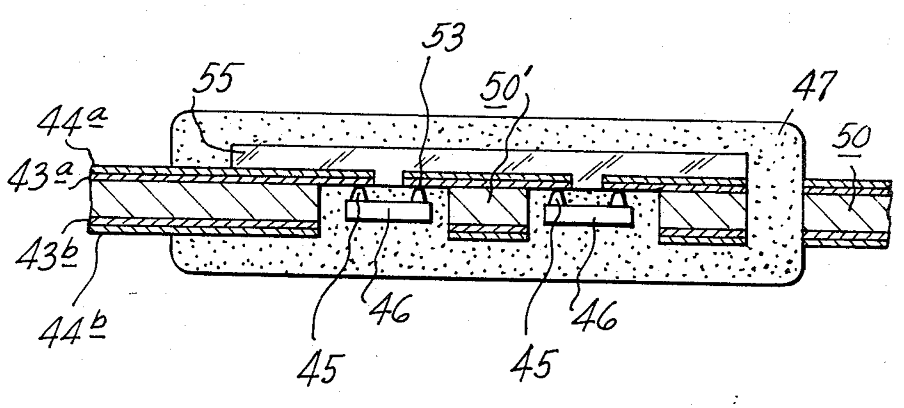
FIG. 22 is an enlarged sectional view taken along the line XXII—XXII on FIG. 17, and showing the lead assembly with a semiconductor integrated circuit mounted thereon.

Both surfaces 41*a* and 41*b* of the base metal plate 41 are covered with photo-resist layers 42*a* and 42*b* which are then selectively etched away by photoetching techniques in such a manner that the photo-resist layer 42*a* is removed in the pattern of the final lead assembly shown in FIG. 17 while the photo-resist layer 42*b* is removed in similar pattern but not at the areas corresponding to the tips 53 and 53' of the leads 50 and 50'.

Figure 18:
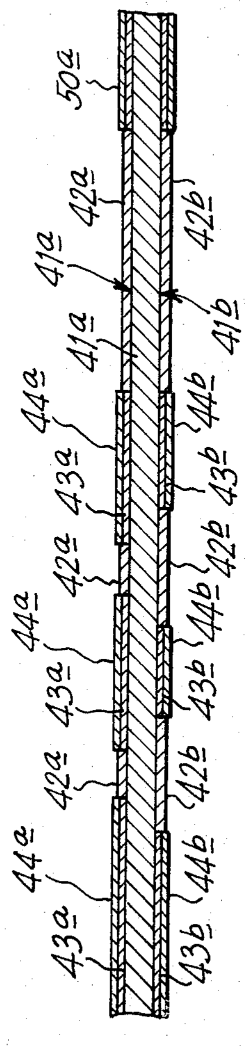
FIGS. 18 to 21 are sectional views illustrating the steps in manufacturing the lead assembly depicted in FIG. 17.
Figure 19:
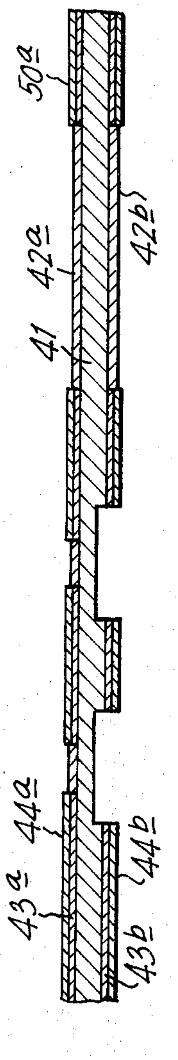

Then, metal layers 43*a* and 43*b* are deposited by electrolytic plating on the surfaces of the base metal plates 41 masked by the remaining photo-resist layers 42*a* and 42*b* and, if necessary, second metal layers 44*a* and 44*b* are similarly deposited on the metal layers 43*a* and 43*b* by means of electrolytic plating (FIG. 18). The metal layers 43*a* and 43*b* may be formed of, for example, nickel to a thickness of, for instance 25 to 30 microns. In the case where there is a small difference between the etching speeds of the metal layers 43*a* and 43*b* and the base metal plate 41, the second metal layers 44*a* and 44*b* can be formed of an etching-proof material, such as, gold.

Thereafter, the photo-resist layer 42*b* is removed with a suitable solvent, for example, toluene, only at those areas corresponding to the tips 53 of the lead arms 50 of the completed lead assembly (FIG. 19) and the exposed areas of the base metal plate 41 are etched away to a depth substantially half the thickness thereof. The etchant for this etching may be a mixed solution of ferric chloride or an ammonium persulfate 25 percent and phosphoric acid.

Figure 20:
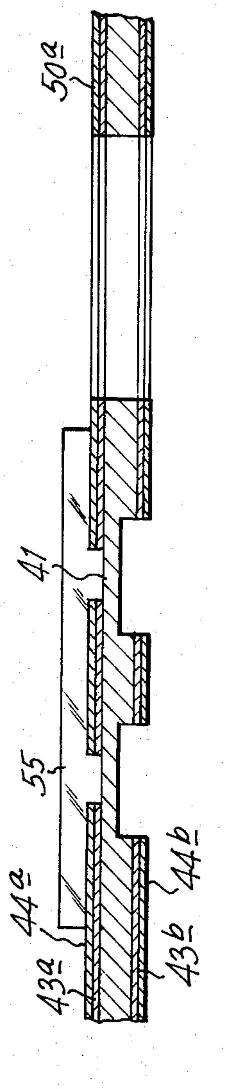
Figure 21:
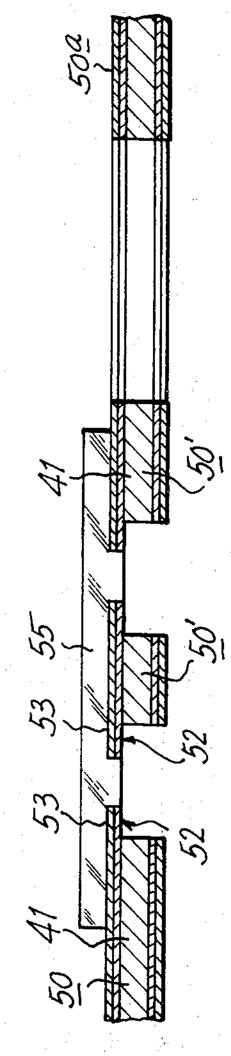

Subsequent to the above initial etching of the base metal plate 41, the remaining photo-resist layers 42*a* and 42*b* are all removed with toluene, and then insulating base plate 55 is mounted on the plated base metal plate 41 at the side of the latter constituted by metal layers 43*a* and 44*a* (which will ultimately form the tips of the lead arms), as illustrated in FIG. 20. In the case where the base plate 55 is formed of glass or ceramics, it may be attached to the base metal plate 41 through the use of an adhesive binder composed of epoxy resin, phenol resin or the like, and in the case of the insulated base plate 55 being formed of resin, it may be assembled with the base metal plate 41 by knowm molding means.

Next, the base metal plate 41 is subjected to etching from its both surfaces with the metal layers 44*a*, 43*a* and 44*b*, 43*b* and the insulating base plate 55 acting as masks. The above-mentioned etchant may be used in this further etching operation. As the result of the further etching, as shown on FIG. 21, there is left to form the tip 53 of each lead arm 50 the portions 52 of metal layers 43*a* and 44*a*, and the internal connection leads 50' are left on the underside of the insulating base plate 55 at locations between those areas of the base metal plate 41 which, in the process step of FIG. 19, had been previously etched away to a depth substantially one-half the thickness thereof.

In the lead assembly of the presently described embodiment, the tips 53 of the lead arms 50 are again formed thin, as by electrolytic plating, so that the spacing and width of the tips of the lead arms can be made extremely small to facilitate their connections to the electrodes of miniaturized integrated circuits. As will be apparent from FIGS. 17 and 21, the internal connection leads 50' provided simultaneously with the external leads 50 make it possible to obtain internal connections between electrodes at the same time that external connections are provided for electrodes of semiconductor pellets 46 by the so-called face-down-bond method as shown on FIG. 22. More specifically, the integrated circuits 46 having formed thereon many projecting electrodes 45 are coupled with the lead assembly by the so-called face-down-bond method in such manner that electrodes 45 engage the corresponding tips 53 and 53' of the external and internal lead arms 50 and 50', after which the lead arms 50 and 50' and the integrated circuits 46 are secured together, for example, by being embedded in a body 47 of epoxy resin. Then, the external leads 50 are severed along the broken lines 48 shown on FIG. 17 so as to be electrically independent of each other.

It will be apparent that many modifications and variations may be effected in the described embodiments of the invention by one skilled in the art without departing from the scope or spirit of this invention.

What is claimed is:

1. A method of making an electrical lead assembly having an outer frame and a plurality of lead arms extending inwardly from said frame to respective free ends which are spaced from each other for connection to respective miniaturized circuit elements, comprising the steps of providing an electrically conductive base metal plate, applying a lead metal layer on each of the opposite surfaces of said base metal plate in patterns generally corresponding to that of the desired frame and lead arms and of a conductive metal that resists etching by an etchant for said base metal plate, the lead metal layer applied to one of said surfaces extending beyond the lead metal layer applied to the other of said surfaces only at the portions of the respective patterns corresponding to said free ends of the lead arms, and then exposing both of said surfaces of said base metal plate to said etchant so as to selectively remove said base metal plate at the areas thereof free of said lead metal layer on either of said surfaces, whereby the lead metal layer on said one surface of the base metal plate extends beyond the latter to constitute relatively thin tips at said free ends of the respective lead arms.

2. The method according to claim 1, in which each said lead metal layer is applied to said base metal plate by electrolytic plating on the latter.

3. The method according to claim 1, in which each said lead metal layer is applied in the respective pattern by first depositing a photo-resist layer on the related surface of the base metal plate, exposing and developing said photo-resist layer to have portions of the latter on said base metal plate in a negative to said respective pattern, and then plating said lead metal layer on the areas of said related surface of the base metal plate which are free of the developed photo-resist layer.

4. The method according to claim 1, in which each said lead metal layer is applied in the respective pattern by first forming said lead metal layer on the entire area of the related surface of the base metal plate, depositing an etch-proof layer on said metal layer in said respective pattern, and then etching away the portions of said lead metal layer which are exposed by said pattern of the etch-proof layer.

5. The method according to claim 1, in which said pattern of each said lead metal layer further includes elongated portions of the respective lead metal layer which are spaced from said frame and from said lead arms, and, prior to the selective removal of said base metal plate by said etchant at said areas free of the lead metal layer on either of said surfaces, an insulating plate is joined to said lead metal layer on said one surface at said lead arms and at the portions thereof corresponding to said elongated portions of the lead metal layer.

* * * * *

UNITED STATES PATENT OFFICE

CERTIFICATE OF CORRECTION

Patent No. 3,773,628 Dated November 20, 1973

Inventor(s) Akira Misawa; Gyoji Suzuki; Keiichi Nakamura

It is certified that error appears in the above-identified patent and that said Letters Patent are hereby corrected as shown below:

In the heading, correct Appl. No.: 149,898 to read

-- Appl. No.: 140,898 --.

Signed and sealed this 14th day of May 1974.

(SEAL)
Attest:

EDWARD M.FLETCHER,JR.
Attesting Officer

C. MARSHALL DANN
Commissioner of Patents

FORM PO-1050 (10-69)

USCOMM-DC 60376-P69
★ U.S. GOVERNMENT PRINTING OFFICE : 1969 O—366-334.